United States Patent [19]

Tasch, Jr. et al.

[11] 4,152,779

[45] May 1, 1979

[54] MOS RAM CELL HAVING IMPROVED REFRESH TIME

[75] Inventors: Al F. Tasch, Jr., Richardson; Pallab K. Chatterjee, Dallas; Horng-Sen Fu, Dallas; Geoffrey W. Taylor, Dallas, all of Tex.

[73] Assignee: Texas Instruments Incorporated, Dallas, Tex.

[21] Appl. No.: 894,078

[22] Filed: Apr. 6, 1978

[51] Int. Cl.$^2$ .............................................. G11C 11/40
[52] U.S. Cl. .................................. 365/222; 365/174; 357/40; 307/238
[58] Field of Search ....................... 365/222, 174, 178; 357/40, 41; 307/238

[56] References Cited

U.S. PATENT DOCUMENTS

| | | | |
|---|---|---|---|
| 3,387,286 | 6/1968 | Dennard | 365/150 |
| 3,720,922 | 3/1973 | Kosonoky | 365/150 |

*Primary Examiner*—Terrell W. Fears
*Attorney, Agent, or Firm*—James T. Comfort; Gary C. Honeycutt

[57] ABSTRACT

In a microelectronic, metal-oxide-semiconductor dynamic random access memory cell having an MOS capacitance signal storage region, leakage current has been found to have a critical dependence upon the voltage level at which the storage gate is operated ($V_{STORE}$). The leakage rate undergoes a sharp transition to a low state below a certain critical $V_{STORE}$. This transition is due to the shutting off of the leakage from the periphery and field region around the cell. Consequently, maximum refresh time is achieved by modifying the cell to permit operation of the storage gate below the critical voltage, which may be at or near ground level. For an n-channel cell, permanently shifting the flatband voltage at the silicon-oxide interface of the storage capacitor in the negative direction can generate a potential well for charge storage with a very small $V_{STORE}$. Preferably, this flatband voltage shift is achieved by a shallow implant of a donor impurity in the silicon surface of the storage region of an n-channel device, or an acceptor impurity for a p-channel device.

The critical maximum $V_{STORE}$ is a function of the channel-stop doping level. Increasing the channel-stop doping level results in a higher critical $V_{STORE}$ without a significant increase in leakage; however, since circuit speed and breakdown voltage are reduced by increased channel-stop doping, such an alternative option cannot fully offset the need for a shift in the flatband voltage, so that the low leakage condition is achieved by a combination of increased channel-stop doping and shifted flatband to permit lower $V_{STORE}$.

14 Claims, 8 Drawing Figures

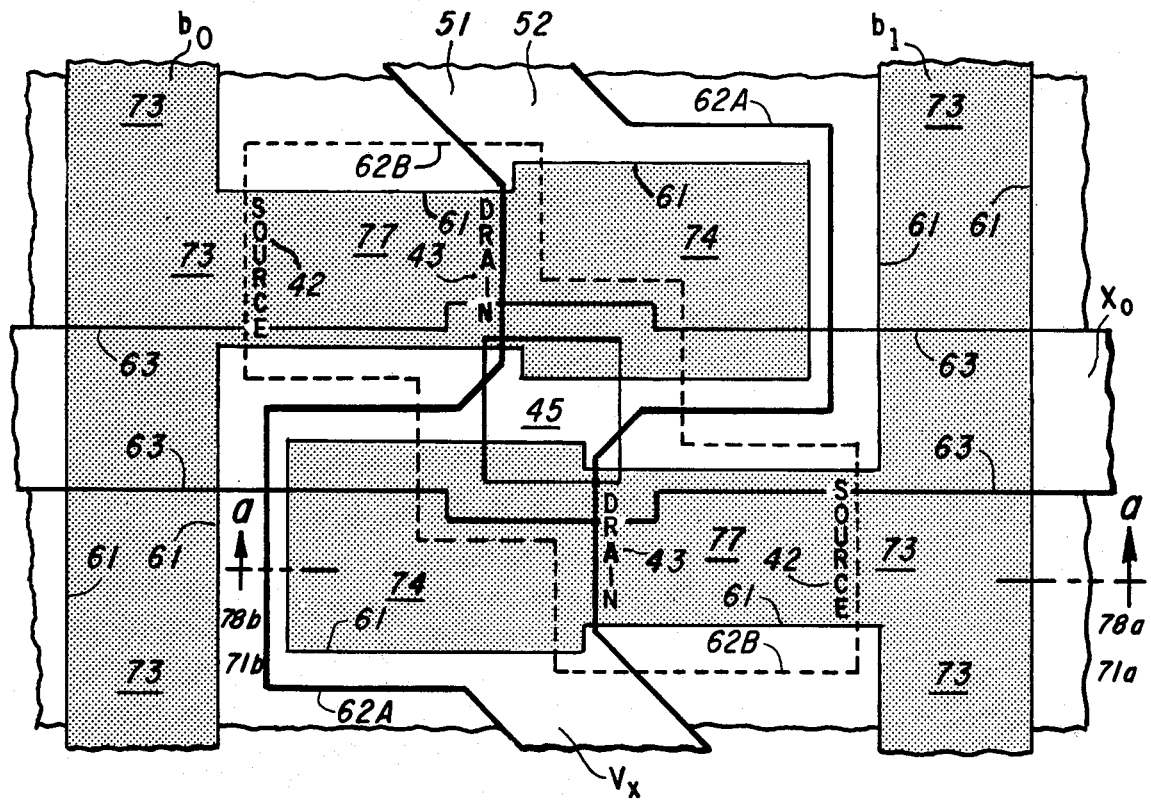
Fig. 6
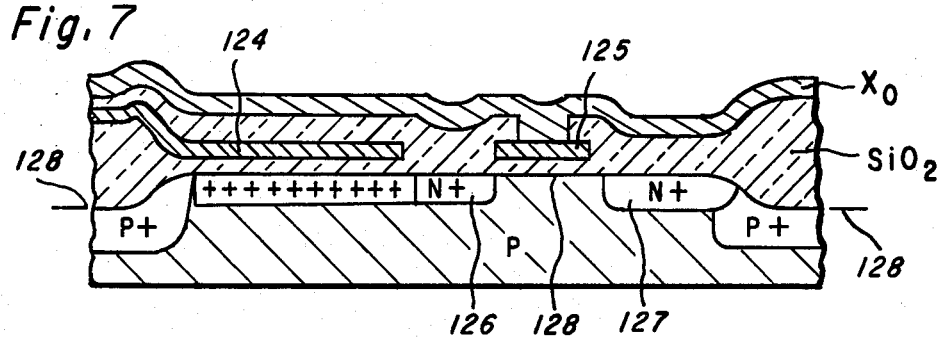
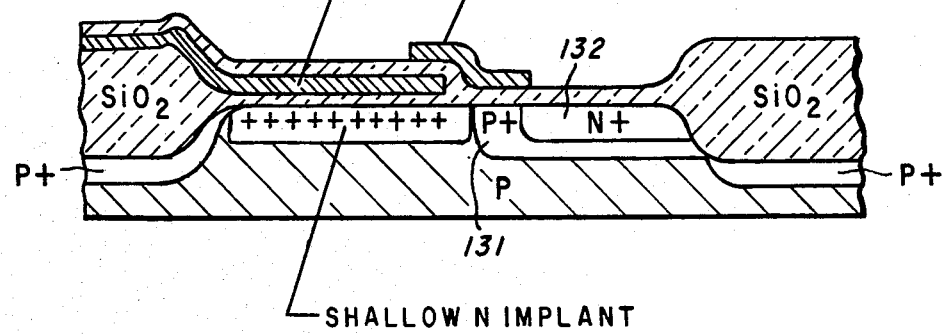

MOS RAM CELL HAVING IMPROVED REFRESH TIME

This invention relates to memory cells having a capacitive signal storage region, and more particularly relates to a microelectronic, metal-oxide-semiconductor dynamic random access memory (RAM) cell having an MOS capacitor signal storage region modified to improve its refresh time. Operation of the storage gate at reduced voltage ($V_{STORE}$) has been found to isolate the storage region from leakage charge generated in the field region and around the periphery of the cell.

There is a continuing trend in the computer industry to demand more and more storage capacity in the form of high-density, low-cost memories. For example, semiconductor memories have been developed wherein the number of bits of storage per chip has increased from 16 to 16,000. In addition, the cost per bit has been reduced by a factor of approximately 200.

Thousands of semiconductor memory cells are formed on a single chip and interconnected to form large memory systems. The production cost of a semiconductor memory lies primarily in the bonding, packaging, testing and handling operations rather than in the cost of the silicon chip which contains the actual circuitry. Thus, any circuit which can be contained within a given chip size, for example 30,000 square mils, will cost about the same as any other. By forming large numbers of memory cells in a single chip, large economies in the cost per bit can result if reasonable yields can be obtained. However, as the size of the chip increases, the yield decreases; so that the advantage of large chip size is generally outweighed by reduction in yields. Presently, chips of about 150 to 250 mils on a side are commonly made. Accordingly, it is desirable to reduce the area occupied by each cell in a random access memory. Two types of dynamic RAM cells are currently used in the construction of semiconductor memories. These cell types are the single-level polysilicon one-transistor cell, and the double-level polysilicon one-transistor cell. See for example U.S. Pats. No. 3,387,286 by R. H. Denard and U.S. Pat. No. 3,720,922 by W. F. Kosonocky.

Although both the single-level and double-level polysilicon one-transistor cells have performed adequately, they do experience an undesirable amount of leakage current, which is a measure of the number of minority carriers thermally generated in a cell. These charge carriers gradually reduce the magnitude of the signal charge stored in the cell, and eventually may totally cancel the information charge. This effect is aggravated at the high temperature (70°-90°) at which these cells have to operate.

In order to avoid this effect, the information charge in the cell must be periodically refreshed at minimum intervals of time, inversely proportional to the magnitude of the leakage current. It is an experimentally verified fact that leakage current in the available one-transistor cells is typically three to eight times greater than that of the charge-coupled RAM cell, for example, as described in U.S. Pat. No. 4,060,738 issued Nov. 29, 1977. However, the charge capacity of the charge-coupled cell is only about half the charge capacity of the one-transistor cell. Therefore, since no single cell type has both a low leakage current and a high charge capacity, there is a substantial incentive to reduce leakage current in the one-transistor cell.

A new one-transistor cell has recently been developed, known as the high capacity ("Hi-C") cell disclosed in application Ser. No. 740,528, filed Nov. 10, 1976. Although the Hi-C cell has reduced leakage current, compared to previously available one-transistor cells, further improvement is achieved by the present invention.

In a microelectronic, metal-oxide-semiconductor dynamic random access memory cell having an MOS capacitance signal storage region, leakage current has been found to have a critical dependence upon the voltage level at which the storage gate is operated ($V_{STORE}$). The leakage rate undergoes a sharp transition to a low state below a certain critical $V_{STORE}$. This transition is due to the shutting off of the leakage from the periphery and field region around the cell. Consequently, maximum refresh time is achieved by modifying the cell to permit operation of the storage gate below the critical voltage, which may be at or near ground level. For an n-channel cell, permanently shifting the flatband voltage at the silicon-oxide interface of the storage capacitor in the negative direction can generate a potential well for charge storage with a very small $V_{STORE}$. Preferably, this flatband voltage shift is achieved by a shallow implant of a donor impurity in the silicon surface of the storage region of an n-channel device, or an acceptor impurity for a p-channel device.

The critical maximum $V_{STORE}$ is a function of the channel-stop doping level. Increasing the channel-stop doping level results in a higher critical $V_{STORE}$ without a significant increase in leakage; however, since circuit speed and breakdown voltage are reduced by increased channel-stop doping, such an alternative option cannot fully offset the need for a shift in the flatband voltage, so that the low leakage condition is achieved by a combination of increased channel-stop doping and shifted flatband.

The lowering of $V_{STORE}$ isolates the storage region from leakage charge generated in the field region and around the periphery of the cell. Thus, a preferred embodiment of the invention is a memory system of the type having an array of memory cells selectively addressed by row and column lines, wherein each cell is of the one-transistor type having an MOS capacitive signal storage region. Each cell of the array, characterized by reduced leakage current and, consequently, improved refresh time, includes a monocrystalline semiconductor substrate of one conductivity type, an adherent dielectric layer on one surface thereof, said dielectric layer including a relatively thick field region surrounding a relatively thin storage and transfer region. A storage gate electrode is provided over a first portion of the relatively thin dielectric, extending in part over said relatively thick dielectric. A transfer gate electrode is provided covering a second portion of the relatively thin dielectric region and is insulated from said storage gate electrode. A charge storage region in the substrate is aligned with the thin dielectric portion of said storage gate electrode, said storage region including a shallow substrate layer wherein the surface potential is adjusted to provide a potential well for charge storage, and to permit operation of the storage gate at reduced voltages.

For example, one embodiment of the invention is an array wherein each of the memory cells is fabricated to include a P-type semiconductor substrate region having an N+ zone therein to form a bit line and an MOS transistor source. A storage region in the substrate is spaced apart from the N+ zone, including an N-type implant lying near the interface of the substrate with storage gate oxide. The implant is very shallow and the dosage thereof is selected to provide a surface potential at or near the silicon-oxide interface such that a potential well is provided for charge storage, at or near zero gate bias (e.g., 0–3 volts). An MOS transfer region is formed in the substrate surface between the N+ region and the storage region. A storage gate region overlies the insulating layer above the storage region; and a transfer gate region overlies the insulating layer above the transfer region. A second insulating layer separates and overlies the storage gate region and the transfer gate region. A row line overlies the second insulating layer and is electrically connected to the transfer gate region by a contact which penetrates the second insulating layer.

A second embodiment of the invention includes all the above features, and in addition, the channel-stop doping level is increased, so that a higher $V_{STORE}$ is permitted without significantly increasing leakage current. Accordingly, the implant dosage requirement is reduced. Normally, channel-stop doping is about $5 \times 10^{15} cm^{-3}$, whereas in this embodiment of the invention channel-stop doping is increased to the range of $5 \times 10^{16} cm^{-3}$ to $5 \times 10^{17} cm^{-3}$.

When the concept of the invention is implemented in a Hi-C cell, as described in the above referenced Tasch application, a second implant, of P-type impurity ions, is provided in the storage region beneath the N-type implant. Also, the N-type implant dosage is increased by an amount substantially equivalent to the P-type implant dosage, whereby the excess surface potential provided by the N-type implant is still sufficient to generate the same potential well as before for a zero or near zero bias on the storage gate. The deep boron implant also penetrates the tapered region of the periphery and adds to the channel-stop doping in the tapered region. This may also cause a shift in the critical $V_{STORE}$ to lower voltages.

FIG. 6 is a greatly enlarged top view of two of the memory cells of FIG. 4.

FIG. 7 is a greatly enlarged cross sectional view of a third embodiment of the invention.

FIG. 8 is a greatly enlarged cross sectional view of a fourth memory cell whose construction embodies the invention.

Figure 1:
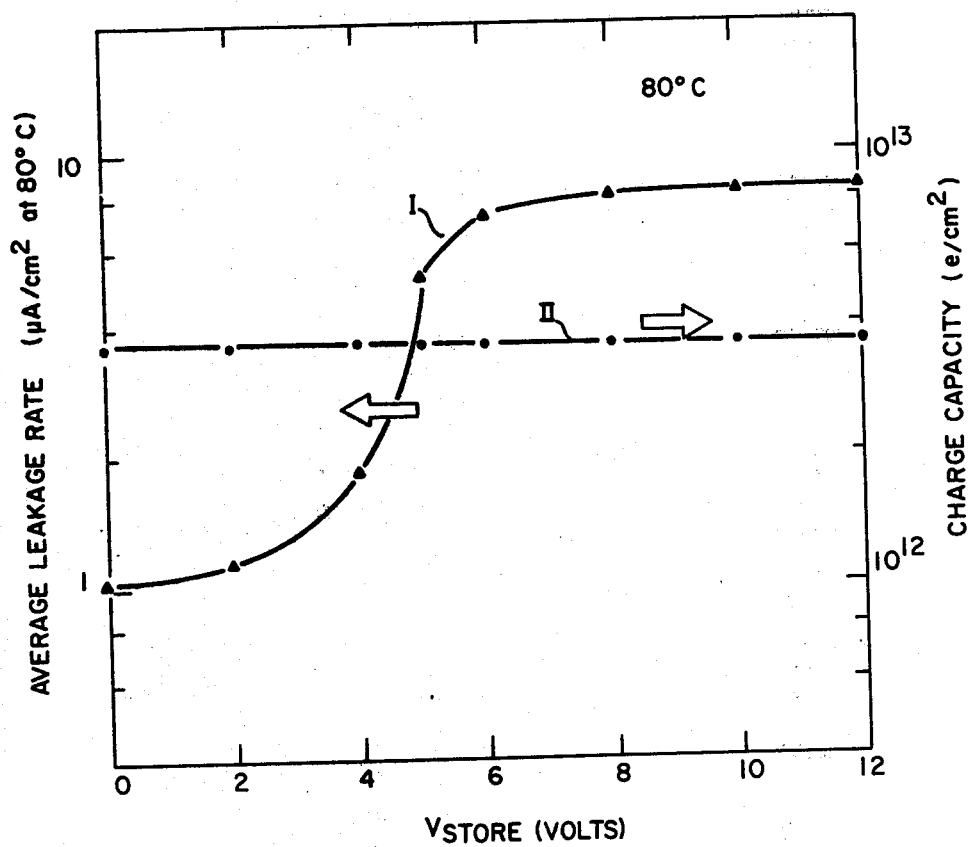
FIG. 1 is an experimental plot of the relationship between leakage current and storage gate voltage ($V_{STORE}$).

FIG. 1 shows that an eight-fold reduction in leakage current can be obtained simply by operating the storage gate of the cell ($V_{STORE}$) at a voltage near ground level, i.e., 0–3 volts. This improvement in leakage current is due to a change in the slope of the empty-well surface potential beneath the field oxide near the storage region, to form a potential barrier which isolates the storage region from leakage charge generated in the field region and around the periphery of the cell.

Since three volts by itself is not sufficient to achieve the necessary potential well for signal storage in prior cells, the cell of the present invention is provided with a permanent negative shift in the flatband voltage at the silicon-oxide interface of the storage region, thereby enabling a potential well of 12 volts, for example, to be generated by a 3-volt $V_{STORE}$. Because of this flatband shift, the storage capacity of the cell is independent of $V_{STORE}$, as demonstrated in FIG. 1.

Figure 2:
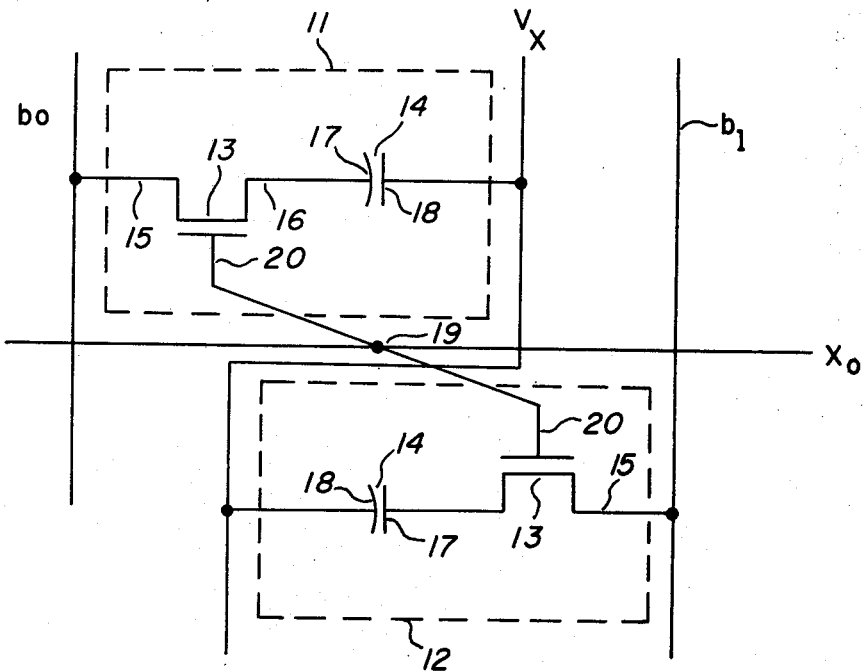
FIG. 2 is a circuit diagram of two memory cells as contained in a memory array, wherein the improvement of the invention is applicable.

In FIG. 2 the bit lines of a memory array are designated $b_0$ and $b_1$ while the word line is $X_0$ and the storage line is $V_X$. The diagram includes two memory cells, 11 and 12, wherein each of the components in cell 11 is identical to its corresponding component within cell 12. Thus, each cell includes an insulated gate field-effect transistor 13 and an MOS capacitor 14. Input/output region 15 of the cell is provided by the source of transistor 13. Drain 16 of transistor 13 couples to plate 17 of the capacitor. A fixed voltage $V_X$ is applied to a second plate 18 of the capacitor.

Row line $X_0$ couples through contact 19 to transfer gates 20 of transistors 13. Therefore, by selectively raising or lowering the voltage on the row line, transistors 13 turn "on" and turn "off". When the transistor is "on" the capacitor charges to the voltage level of the bit line; and when the transistor is "off" the charge in capacitor 14 remains unchanged. The quantity of charge in the capacitor represents the information stored in each cell.

Figure 3:
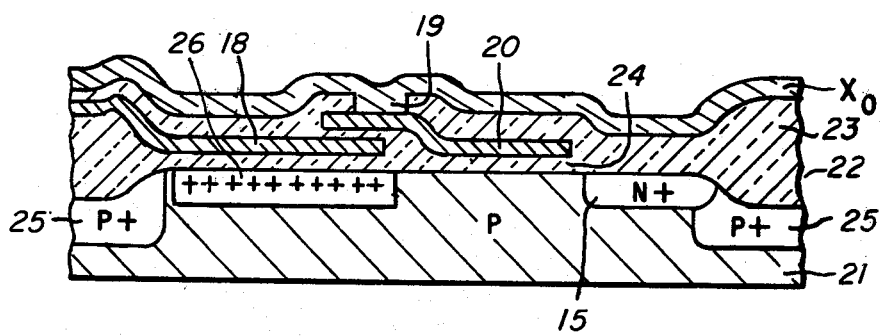
FIG. 3 is a greatly enlarged cross sectional view of an MOS dynamic RAM cell of the invention.

In FIG. 3, the cross section exposes all the components of a single memory cell, including monocrystalline semiconductor substrate 21, and adherent dielectric layer 22 on one surface thereof, including a relatively thick field region 23 and a relatively thin storage and transfer region 24. Channel-stop region 25 in the substrate adjacent the relatively thick dielectric has the same conductivity type as the substrate, and an impurity concentration of $5-25 \times 10^{15} cm^{-3}$. Storage gate electrode 18 covering the first portion of said relatively thin dielectric extends in part over the thick dielectric. Transfer gate electrode 20 covering a second portion of thin dielectric 24 is insulated from storage gate electrode 18. A charge storage region 26 in said substrate is aligned with the thin dielectric portion of the storage gate electrode. The storage region includes a shallow N-type layer ($\simeq 1500 Å$) wherein the surface potential is adjusted to provide a potential well for charge storage. The dosage of the implant is sufficient to provide a potential well at or near zero gate bias on the storage electrode having a magnitude at least as great as the surface potential obtained by turning the transfer gate "on". For example, an N-type implant of $8.8 \times 10^{11} cm^{-2}$ in the Si substrate provides a surface potential change of two volts if the gate oxide thickness is 500Å.

Figure 4:
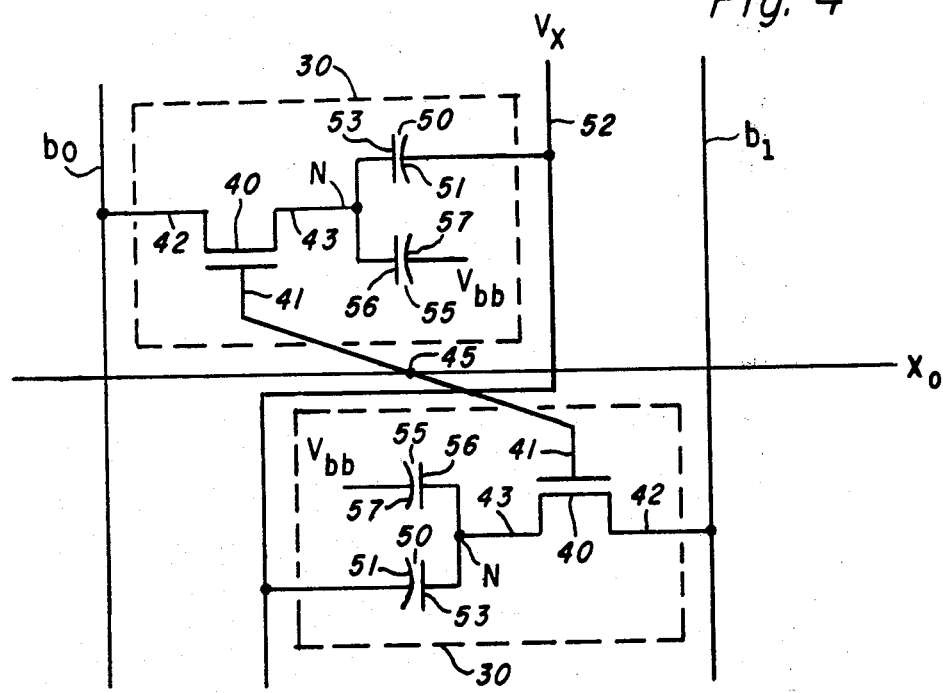
FIG. 4 is a circuit diagram of two Hi-C memory cells arranged for inclusion in a memory array.

Referring next to FIG. 4, a circuit diagram of two of the Hi-C memory cells in an array is illustrated. In this figure, the labeling on the bit lines is shown as $b_0$, $b_1$; and the row line is shown as $X_0$.

The circuit of FIG. 4 is comprised of an insulated gate field effect transistor 40, an oxide capacitor 50, and a depletion capacitor 55. Input/output region 42 of the cell is provided by the source of transistor 40. The drain 43, of transistor 40 couples to a node N; and node N couples to a plate 53 of capacitor 50, and to a plate 56 of capacitor 55. A fixed voltage $V_x$ is applied to a second plate 51 of capacitor 50; while the second plate 57 of capacitor 55 is connected to the substrate bias voltage $V_{bb}$.

Row line $X_0$ couples to the transfer gates 41 of transistors 40. Therefore, by selectively raising or lowering the voltage on the row lines, transistors 40 turn on and turn off. When transistor 40 is on, capacitors 50 and 55 charge node N to the voltage level of the bit line and when transistor 40 is off, the charge in capacitors 50 and 55 remains unchanged. The quantity of charge in capacitors 50 and 55 (the voltage at node N) represents the information stored in the memory cells.

To understand the significance of the Hi-C RAM cell concept, it is important to emphasize that the charge in cell 30 is not only stored on oxide capacitor 50, but that it is also stored on depletion capacitor 55. In the past, depletion capacitor 55 has been neglected because for conventional substrate dopings of MOS RAM cells, the depletion capacitance is approximately 10 times smaller than the oxide capacitance. And in the past, nobody had successfully found a way to utilize the depletion capacitance to increase the amount of charge that could be stored in the cell.

The depletion capacitance can be increased by increasing the substrate doping in the region which forms capacitors 50 and 55. For example a P-type implant could be added to a P-type substrate. However, this increased substrate doping also causes the voltage swings which occur at node N to be reduced. And this, in turn, causes the charge capacity of the cell to actually be reduced. This fact has previously been documented. See for example, an article by A. F. Tasch, Jr. et al. in the IEEE Journal of Solid-State Circuits for February 1976.

However, if a shallow implant (at or very near $SiO_2$-Si interface) of conductivity type opposite to the substrate is also added, the flatband voltage in the storage region is shifted in the negative direction. This then allows the potential of node N to maintain its full original swing while at the same time increasing the depletion capacitance. As a result, the charge capacity of the cell may be increased by as much as 100%. This is an important aspect of the Hi-C cell.

In order to add the concept of the present invention to the Hi-C RAM cell, it is essential that the dosage level of the shallow implant be increased sufficiently to exceed the effect of the second, deeper implant by a margin sufficient to generate a potential well in the substrate, at a critically small storage gate bias, of a magnitude at least equal to the potential well created in the transfer region by turning the transfer gate "on".

Figure 5:
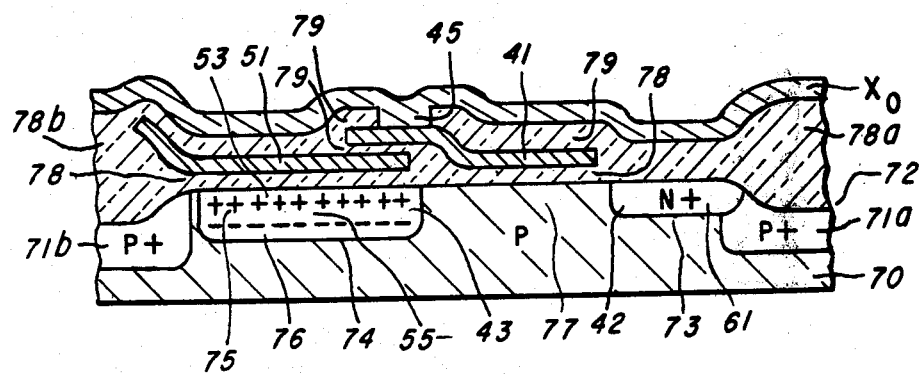
FIG. 5 is a greatly enlarged cross sectional view of a Hi-C memory cell incorporating the concept of the present invention.

Referring next to FIGS. 5 and 6, the detailed physical structure of one preferred embodiment of the Hi-C memory cells is illustrated. In these figures, the actual size of the cell is greatly enlarged. FIG. 5 is a cross-sectional view, taken along line a—a in FIG. 6. This cross-section cuts through one Hi-C memory cell, and exposes all the components of the cell. Implants in the various doped regions are labeled in FIG. 5 for an N-channel cell. However, the structure could easily be modified to provide a P-channel cell as another embodiment.

The Hi-C memory cell is formed by utilizing a P-type semiconductor substrate 70. This substrate has a surface 72 near which several elements of the memory cell are formed. In particular, an N+ region 73 near surface 72 forms bit line b1 and transistor source 42. A storage region 74 is formed by two ion implants 75 and 76 near surface 72. Region 74 forms capacitor 55, plate 53 of capacitor 50, and drain 43. The implants in region 74 are spaced apart from N+ region 73 and overlie each other. Implant 75 is of an N-type material and it lies relatively near surface 72. The other implant 76 of the pair is of a P-type material, and it lies beneath the N-type implant. In the drain 43 area the P-type implant either coincides with or lies within the N-type implants. This avoids potential barriers to charge flow between storage region 74 and bit line 73.

An MOS transistor region 77 is formed in surface 72 between N+ region 73 and storage region 74 as a result of the substrate being a P-type material. An insulating layer 78 overlies substrate surface 72. In one embodiment, insulating layer 78 is formed of $SiO_2$ and is about 1000Å thick. Storage gate 51 overlies insulating layer 78 above storage region 74; and transfer gate 41 overlies insulating layer 78 above transfer region 77 and partially overlies storage gate 51. Gates 41 and 51 are comprised of a conductive material, such as a polysilicon or a metal for example; and they are about 4000Å-6000Å thick. Insulating layer 78 can be of different thickness for storage and transfer regions.

FIG. 6 is a top view of two Hi-C memory cells that are arranged in accordance with the circuit diagram of FIG. 4, and the cross-sectional view of FIG. 5. The various regions illustrated in FIG. 6 lie on one of three levels as previously described. Components lying on the lowest layer are enclosed by lines 61. These components include the bit lines, $b_0$ and $b_1$, the transistor sources 42, the transistor drains 43, the transfer area 44 between the source and drain regions, and the storage region 74 with the double level implants.

The components lying on the second level are enclosed by lines 62A and 62B. A thin insulating layer, of $SiO_2$ for example, separates the first and second levels. The area enclosed by lines 62A forms storage gate 51 and storage line 52. Thus, in this configuration, storage gate 51 and storage line 52 are physically integrated into one area. This area is then connected to a fixed voltage source $V_x$. Similarly, the area enclosed by line 62B forms the transfer gates 41 of transistors 40.

Row line $X_0$ lies on the third level; and it occupies the area enclosed by line 63. The second oxide layer (6000-10,000Å) separates the second and third levels. Electrical connection is made between row line $X_0$ and gates 41 by a contact 45. This contact penetrates the oxide separating the second and third layers.

Of particular importance in this invention is structural details of storage region 74. There the P-type implant (boron, for example) is made to a depth of about 2000Å-10,000Å from surface 72; and the N-type implant (arsenic, for example) is made to a depth of about 100-1000Å. Note that these implants actually have a Gaussian distribution in surface 72 and therefore these numbers define the depth at which the distribution peaks occur.

Boron typically is used as the deeper implant. This implant may be made into the bare silicon surface 72 before insulating layer 78 is grown. Or alternatively, it can be made directly through insulating layer 78 after the layer is formed. In this latter case, the ion-implant is made at approximately 100-200 Kev. The dose in the silicon typically ranges from $1-10 \times 10^{12}$ ions/cm$^2$.

The shallow implant typically is arsenic or antimony. Other elements are also acceptable, but these elements are typically used because they have a heavy mass and diffuse slowly. Therefore, they remain at or very near surface 72 during subsequent fabrication steps which are required to form the cell and any associated on-chip circuitry.

Arsenic or antimony can be implanted directly into the bare surface 72 before insulating layer 78 is formed. This process uses an implant energy of approximately 10 Kev to 50 Kev. Alternatively, these implants can be made after insulating layer 78 is formed. One way to do this is to use a high implant energy. As an example, approximately 150–200 Kev may be required. The high energy is required due to the heavy mass of the ions.

Alternatively, a conveniently lower implant energy can be used which will place most of the dopants within insulating layer 78. The concentration of these dopants is chosen so that the desired amount will subsequently diffuse from insulating layer 78 into surface region 72 during the remaining steps of fabrication. As an example of the approach, arsenic is implanted into 1000Å of gate oxide at 105 Kev. The concentration is typically $1-8 \times 10^{13}$ ions/cm$^2$. The amount of arsenic which subsequently diffuses into surface 72 ranges from $1-6 \times 10^{12}$ ions/cm$^2$.

Fabrication of the cell of FIG. 3 is the same as for the cell of FIG. 5, except for the omission of the deeper implants, and the smaller dosage of the shallow N-type implant.

Referring now to FIG. 7, another embodiment of the invention is illustrated. This embodiment is similar in many respects to the previously described cells. For example, it includes a storage region 121 which has a shallow N-type implant 123 having a concentration dosage equivalent to the previously described shallow implant of FIG. 3. This cell also includes an overlying storage gate 124 and a transfer gate 125 which are separately operable from each other. However, the two cell embodiments differ from each other, in that this embodiment includes an additional N+ type region 126 similar to the N+ region 127. Region 126 is adjacent to storage region 121 and is spaced apart from a source-bit line region. Also, transfer gate 125 does not overlie storage gate 124, but instead overlies the surface region between regions 126 and 127.

The electrical operation of this embodiment is very similar to the electrical operation of the first embodiment. Storage region 121 and region 126 act like storage region 26; and the surface area under gate 125 acts like transfer region under gate 20.

FIG. 8 is a greatly enlarged cross-sectional view of still another memory cell which is constructed according to the invention. This cell structure uses DMOS technology to yield a high density, double-poly cell having a very short channel in the transfer region 131. In accordance with DMOS technology, transfer region 131 is defined by a diffusion, rather than by lithography; and the source-bit line region is formed by a second diffusion 132 lying within this transfer region diffusion. This yields a channel length of approximately 1–2μ. The remainder of the cell is constructed in a manner similar to the previously described in conjunction with FIG. 3.

We claim:

1. A dynamic RAM cell having reduced leakage current and, consequently, improved refresh time, comprising a monocrystalline semiconductor substrate of one conductivity type, an adherent dielectric layer on one surface thereof, said dielectric layer including a relatively thick field region surrounding a relatively thin storage and transfer region, a storage gate electrode covering a first portion of said relatively thin dielectric and extending in part over said relatively thick dielectric, a transfer gate electrode covering a second portion of said relatively thin dielectric and insulated from said storage gate electrode, a charge storage region in said substrate aligned with the thin-dielectric portion of said storage gate electrode, said storage region including a shallow layer wherein the surface potential of the substrate is adjusted to provide a potential well for charge storage, and a channel-stop region surrounding the device wherein the doping level is between $5 \times 10^{16}$ cm$^{-3}$ and $5 \times 10^{17}$ cm$^{-3}$, whereby operation of the storage gate at reduced voltage cuts off leakage current from the field and peripheral regions.

2. A cell as in claim 1 wherein said storage gate electrode extends over said relatively thick dielectric a distance equal to at least twice the thickness of said thick dielectric.

3. A cell as in claim 1 wherein the surface potential of the substrate storage region is adjusted by implanting therein an electron donor impurity in a sufficient concentration to provide a surface potential of greater than $\phi_s(V_{DD})$ on transfer gate for $V_G = 0 - (V_{DD}/2)$ on storage gate.

4. A cell as in claim 1 wherein said transfer gate electrode extends in part above said storage gate electrode.

5. A cell as in claim 1 wherein said storage region includes a first shallow N-type implant and a somewhat deeper P-type implant; the relative dosage of the two implants being such as to provide a potential well in said storage region greater than $\phi_s(V_{DD})$ on transfer gate for $V_G = 0 - (V_{DD}/2)$ on storage gate.

6. An MOS dynamic RAM cell having reduced leakage current and, consequently, improved refresh time, comprising a monocrystalline semiconductor substrate of one conductivity type, an adherent dielectric layer on one surface thereof, said dielectric layer including a relatively thick field region surrounding a relatively thin storage and transfer region, a storage gate electrode covering a first portion of said relatively thin dielectric and extending in part over said relatively thick dielectric, a transfer gate electrode covering a second portion of said relatively thin dielectric and insulated from said storage gate electrode, a charge storage region in said substrate aligned with the thin-dielectric portion of said storage gate electrode, said storage region including a shallow layer wherein the surface potential of the substrate is adjusted to provide a potential well for charge storage, of at least 0.7–7 volts with the storage gate in the "off" condition.

7. A cell as in claim 6 wherein the signal channel is of N-type conductivity.

8. A cell as in claim 6 wherein the signal channel is of P-type conductivity.

9. A cell as in claim 6 selected from single-level and double-level polysilicon one-transistor types.

10. A cell as in claim 6 of the high-capacity one-transistor type.

11. A cell as in claim 6 wherein the semiconductor is selected from III-V compounds and II-VI compounds, including GaAs, InSb, and Hg$_x$Cd$_{1-x}$Te.

12. A cell as in claim 1 wherein the semiconductor is selected from III-V compounds and II-VI compounds, including GaAs, InSb, and Hg$_x$Cd$_{1-x}$Te.

13. A cell as in claim 6 wherein the insulation layers consist of a sandwich of Si$_3$N$_4$ and SiO$_2$.

14. A cell as in claim 1 wherein the insulation layers consist of a sandwich of Si$_3$N$_4$ and SiO$_2$.

* * * * *

UNITED STATES PATENT AND TRADEMARK OFFICE
CERTIFICATE OF CORRECTION

PATENT NO. : 4,152,779
DATED : May 1, 1979
INVENTOR(S) : Al F. Tasch, Jr., Pallab K. Chatterjee, Horng Sen Fu, and Geoffrey W. Taylor It is certified that error appears in the above—identified patent and that said Letters Patent is hereby corrected as shown below:

Claim 3, line 5, replace "0-($V_{DD}/2$)" with
--0 to ($V_{DD}/2$)--;

Claim 5, line 6, replace "0-($V_{DD}/2$)" with
--0 to ($V_{DD}/2$)--;

Claim 6, line 17, replace "0.7-7" with
--0.7--.

Signed and Sealed this

Tenth Day of September 1985

[SEAL]

Attest:

DONALD J. QUIGG

Attesting Officer   Acting Commissioner of Patents and Trademarks - Designate